(12) United States Patent
Behfar et al.

(10) Patent No.: US 7,569,860 B2
(45) Date of Patent: Aug. 4, 2009

(54) INTEGRATED PHOTONIC DEVICES

(75) Inventors: Alex A. Behfar, Ithaca, NY (US);
Malcolm Green, Ithaca, NY (US);
Alfred T. Schremer, Freeville, NY (US)

(73) Assignee: BinOptics Corporation, Ithaca, NY (US)

( * ) Notice: Subject to any disclaimer, the term of this patent is extended or adjusted under 35 U.S.C. 154(b) by 116 days.

(21) Appl. No.: 11/037,334

(22) Filed: Jan. 19, 2005

(65) Prior Publication Data

US 2005/0157770 A1 Jul. 21, 2005

Related U.S. Application Data

(60) Provisional application No. 60/537,248, filed on Jan. 20, 2004, provisional application No. 60/618,134, filed on Oct. 14, 2004.

(51) Int. Cl.
*H01L 29/161* (2006.01)

(52) U.S. Cl. ............................ 257/84; 257/83; 257/80; 257/E33.076; 372/50.1; 372/50.12; 372/50.121; 372/50.21; 372/50.23

(58) Field of Classification Search ............ 257/80–82, 257/83, 84, 85, E33.076; 372/50.21, 50.1, 372/50.12, 50.121, 50.23
See application file for complete search history.

(56) References Cited

U.S. PATENT DOCUMENTS

| 4,692,207 | A | * | 9/1987 | Bouadma et al. ............... 438/24 |
|---|---|---|---|---|
| 4,750,486 | A | * | 6/1988 | Butler et al. .................... 606/18 |
| 4,792,956 | A | * | 12/1988 | Kamin .................. 372/29.021 |
| 4,851,368 | A | * | 7/1989 | Behfar-Rad et al. ........... 438/39 |
| 5,666,376 | A | * | 9/1997 | Cheng ...................... 372/50.21 |
| 5,793,790 | A | * | 8/1998 | Doi et al. .................... 372/50.1 |
| 6,278,173 | B1 | * | 8/2001 | Kobayashi et al. ........... 257/627 |
| 6,580,741 | B2 | * | 6/2003 | Jiang et al. ................ 372/50.11 |
| 6,611,544 | B1 | * | 8/2003 | Jiang et al. ................ 372/50.11 |
| 6,703,644 | B1 | * | 3/2004 | Lell ............................ 257/84 |
| 6,730,990 | B2 | * | 5/2004 | Kondo et al. ................. 257/623 |
| 2002/0175334 | A1 | | 11/2002 | Herold |
| 2004/0021214 | A1 | * | 2/2004 | Badehi et al. ................ 257/690 |
| 2004/0085601 | A1 | * | 5/2004 | Swartz et al. ................ 359/196 |
| 2004/0258121 | A1 | * | 12/2004 | Lee et al. ....................... 372/50 |
| 2005/0147145 | A1 | | 7/2005 | Behfar et al. |
| 2006/0118893 | A1 | * | 6/2006 | Behfar et al. ................. 257/414 |

OTHER PUBLICATIONS

"A New Detector for IRLED Light," OPTO Diode Corp, reprint from Sensors Magzine Dec. 1996.*
Luhs, "Experiment 04 Diodelaser" MEOS Jun. 1992/Jul. 2003.*
Behfar-Rad et al, "Monolithic AlGaAs-GaAs Single Quantum-Well Ridge Lasers Fabricated with Dry-Etched Facets and Ridges," IEEE Journal of Quantum Electronics, vol. 28 ( No. 5), p. 1227-1231, (May 21, 1992).
International Search Report from International Application No. PCT/US05/01783 mailed Sep. 6, 2005.

* cited by examiner

*Primary Examiner*—Matthew Reames
(74) *Attorney, Agent, or Firm*—Jones, Tullar & Cooper, P.C.

(57) ABSTRACT

A laser (22) and detector (24) integrated on corresponding epitaxial layers of a single chip (20) cooperate with on-chip and/or external optics (62) to couple light of a first wavelength emitted by the laser to a single external device such as an optical fiber (60) and to simultaneously couple light of a different wavelength received from the external device to the detector to provide bidirectional photonic operation. Multiple lasers and detectors may be integrated on the chip to provide multiple bidirectional channels.

32 Claims, 8 Drawing Sheets

INTEGRATED PHOTONIC DEVICES

CROSS REFERENCE TO RELATED APPLICATIONS

This application claims the benefit of U.S. Provisional Patent Application No. 60/537,248, filed Jan. 20, 2004, and of U.S. Provisional Patent Application No. 60/618,134, filed Oct. 14, 2004, the disclosures of which are hereby incorporated herein by reference.

BACKGROUND OF THE INVENTION

The present invention relates, in general, to photonic devices, and more particularly to improved monolithically integrated emitting and receiving photonic devices and methods for fabricating them.

Many optical systems, such as, for example, those incorporating or utilizing Passive Optical Networks (PON), require that a single optical fiber be used for both sending and receiving information at multiple wavelengths. In the past, such a capability has been difficult to achieve, particularly in a cost-effective manner, for the combination of a multiplicity of discrete photonic devices that will all have access to a single fiber has presented fabrication problems that have made such arrangements too expensive. The market for PON systems is extremely price sensitive, with the result that the highly desirable, wide range of functions that such networks can make available have not been economically feasible. Similar difficulties have been encountered with the use of multiple photonic devices in other optical systems, such as high definition DVD's, for even in such applications the required high level of functionality is not easily attainable through the use of discrete photonic devices.

SUMMARY OF THE INVENTION

In accordance with one aspect of the present invention, solid state light receiving and light emitting photonic devices are monolithically integrated on a common substrate to provide multiple optical functions on the surface of a single chip. The integration of such devices to provide bidirectional photonic operation is optimized though multilayer epitaxy, wherein lasers and detectors can be fabricated on separate mesas on a chip to provide a high efficiency coupling of the lasers and the detectors to a single optical fiber. In accordance with another aspect of the invention, multiple light emitters and multiple light detectors are fabricated on a single chip so as to permit coupling of multiple emitters and multiple detectors to a single fiber. The emitters may be surface emitting devices fabricated on the surface of a chip, such as those described in U.S. application Ser. No. 10/958,069, filed Oct. 5, 2004, or application Ser. No. 10/963,739, filed Oct. 14, 2004 the disclosures of which are hereby incorporated herein by reference, or may be edge emitting lasers fabricated on a chip, such as those described in U.S. Pat. No. 4,851,368, or IEEE Journal of Quantum Electronics, volume 28, pages 1227-1231, May 1992, with the laser outputs being coupled into an optical fiber. The detectors are also fabricated on the same chip, and may be surface or edge-receiving devices coupled to the same optical fiber to receive optical signals from the fiber. In a preferred form of the invention each of the lasers emits light at a different wavelength and each of the detectors receives light at different wavelengths that differ from those of the emitted light.

Briefly, the invention incorporates laser emitters and photodetectors fabricated on a single chip in which one or more semiconductor detector structures are deposited epitaxially in superimposed layers on a substrate, and a semiconductor emitter structure is epitaxially deposited on the top detector structure. The structures are etched to form one or more emitter mesas incorporating surface or edge emitting lasers to direct emitted light to an optical fiber, and to form one or more detector mesas incorporating surface or edge receiving detectors for receiving light from the optical fiber. Reflectors, deflectors, prisms, gratings or other diffraction elements, and/or lenses may also be fabricated integrally on the substrate or located adjacent to the chip to direct emitted or received light as required.

In one form of the invention, a monolithically integrated photonic chip includes a substrate carrying a semiconductor detector epitaxial structure, with a semiconductor laser structure epitaxially deposited on the detector structure, using known deposition techniques. A surface-emitting laser is fabricated, as by etching, in the emitter structure, and is surrounded by a trench, formed, for example, by etching through the detector structure to the substrate. The surface of the detector structure adjacent the laser is exposed, as by etching away the covering laser structure, to form a detector receiver surface which surrounds, or substantially surrounds, the laser and is spaced from it by the trench, so that the laser and the detector form separate mesas on the common substrate. A metal layer on the surface of the laser provides an electrical contact for application of a suitable bias voltage to cause the laser structure to produce laser light of a known wavelength. The surface-emitting laser acts as a light source, directing a beam of light upwardly through an external lens to an external optical device such as a single optical fiber. The fiber also may direct light of a second wavelength toward the chip, with this received light passing through the lens. Since the received light is of a different wavelength than the light emitted by the laser, the received light will not be focused back into the laser, but will be directed by the lens toward the region surrounding the laser source, where it is received by the detector structure.

In another embodiment of the invention, the monolithically integrated chip includes two superimposed epitaxially deposited detector structures, with a single emitter layer superimposed on the top detector structure. A surface-emitting laser is fabricated on a mesa in the laser structure on the chip, as by etching, and is separated from a surrounding detector mesa by a trench. The laser structure is then removed from the surface of the surrounding two-structure detector mesa. The laser may be energized to emit light of a first wavelength, which may be directed to an optical fiber through a lens, as discussed above. In this embodiment, however, the two detector structures are capable of receiving light of second and third wavelengths, respectively. The provision of a detector mesa around the end and sides of a surface-emitting laser to substantially surround the emitter end of the laser optimizes the bidirectional coupling of the laser and detectors to a single input/output device such as an optical fiber.

In still another embodiment of the invention, a multiplicity of surface-emitting lasers may be fabricated side-by-side on individual mesas in the laser structure of the chip, with each laser in the array emitting light of a different wavelength. In similar fashion, a multiplicity of individual detectors may be fabricated side-by-side on individual mesas in the detector structure, with each detector being capable of receiving light of a distinct wavelength. The emitters and detectors may be optically coupled to a single optic fiber through an external diffraction element such as a prism, and suitable lenses as required.

Edge-emitting lasers and either surface-receiving or edge-receiving detectors may also be utilized in the fabrication of the monolithically integrated bidirectional photonic device of the invention. In one such embodiment, an edge-emitting laser is fabricated on a mesa in a laser structure and a reflector is fabricated on the chip, for example in the laser structure adjacent the laser exit facet, to direct emitted light of a first wavelength vertically upwardly. The reflector may incorporate a flat or a curved reflector surface to direct the light upwardly through an external lens, for example, to an input/output device such as an optical fiber. The reflector is surrounded by an exposed surface-receiving detector structure which is on a mesa separate from the laser mesa and which receives light of a second wavelength from the optical fiber. In another embodiment, the reflector surface includes a dichroic coating, which reflects laser light of the first wavelength, but which passes received light of the second wavelength through the reflector body to the underlying detector structure or structures.

A multiplicity of edge-emitting lasers may be fabricated in an array in the laser structure on the chip to direct light of corresponding wavelengths by way of a diffraction element such as a prism or grating to an external optical fiber. The array may also include a multiplicity of end-receiving detectors fabricated on separate mesas in the detector structure and arranged to receive light of different frequencies from the optical fiber, thus providing a monolithically integrated array of laser and detector channels, in accordance with the invention.

BRIEF DESCRIPTION OF THE DRAWINGS

The foregoing, and additional objects, features and advantages of the invention will become evident from the following detailed description of preferred embodiments thereof, taken with the accompanying drawings, in which.

DESCRIPTION OF PREFERRED EMBODIMENTS

Figure 1:
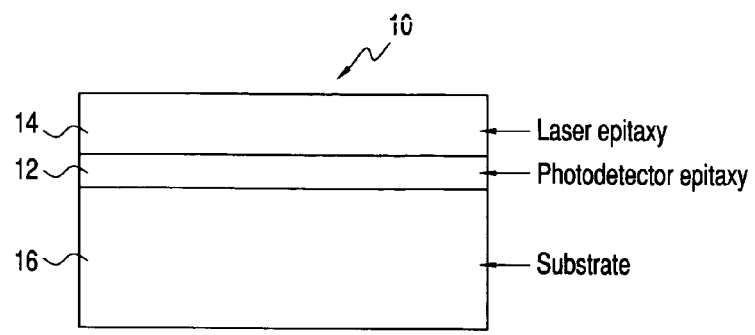
FIG. 1 illustrates a two-layer epitaxial chip structure including a laser structure and a detector structure on a substrate.

Turning now to a more detailed description of the invention, there is illustrated in FIG. 1 a two-layer epitaxial chip 10 incorporating first and second epitaxial structures 12 and 14 superimposed on each other and on a substrate 16. The first structure 12 is a semiconductor material that is epitaxially deposited in conventional manner on a substrate to form a photodetector sensitive to light of a selected wavelength band. The second structure 14 is another semiconductor material that is epitaxially deposited, again in conventional manner, on the first structure 12 and from which a laser can be fabricated.

The structures on the substrate 16 may be formed, for example, from a suitably doped type III-V compound, or an alloy thereof. Layer 12 may be a succession of layers deposited by an epitaxial deposition process such as Metalorganic Chemical Vapor Deposition (MOCVD) or Molecular Beam Epitaxy (MBE). Typically, these layers may include the following layers on an InP substrate: p-doped InP buffer layer, p-doped InGaAs p-contact layer, p-doped InP transition layer, undoped InGaAs detection layer, n-doped InP layer, and an n-doped InGaAs n-contact layer.

The second structure 14 also may be a succession of layers, deposited by the MOCVD or MBE process on the top surface of structure 12, to form an optical cavity incorporating an active region. Although other types of laser cavities can be fabricated in accordance with the invention, the invention will be described herein in terms of ridge lasers, for convenience. As is typical for solid state ridge lasers, the structure 14 includes upper and lower cladding regions formed from lower index semiconductor material, for example InP, than is used in the central active region, which may be formed with In AlInGaAs—based quantum wells and barriers. A transition layer of InGaAsP may be formed in addition to a p-doped InGaAs contact layer on the top part of structure 14 to provide an ohmic contact with a top metal layer, which is deposited on the structure 14, for connecting the device to a bias source.

The structures 12 and 14 may share some of the deposited layers, so that the interface between the structures is common to both. The described layers allow the fabrication in structure 12 of highly sensitive detectors such as p-i-n detectors and avalanche photodetectors that will operate in specific wavelength ranges, or bands, and surface or edge emitting lasers in structure 14 which are able to emit light at selected wavelengths.

Figure 2:
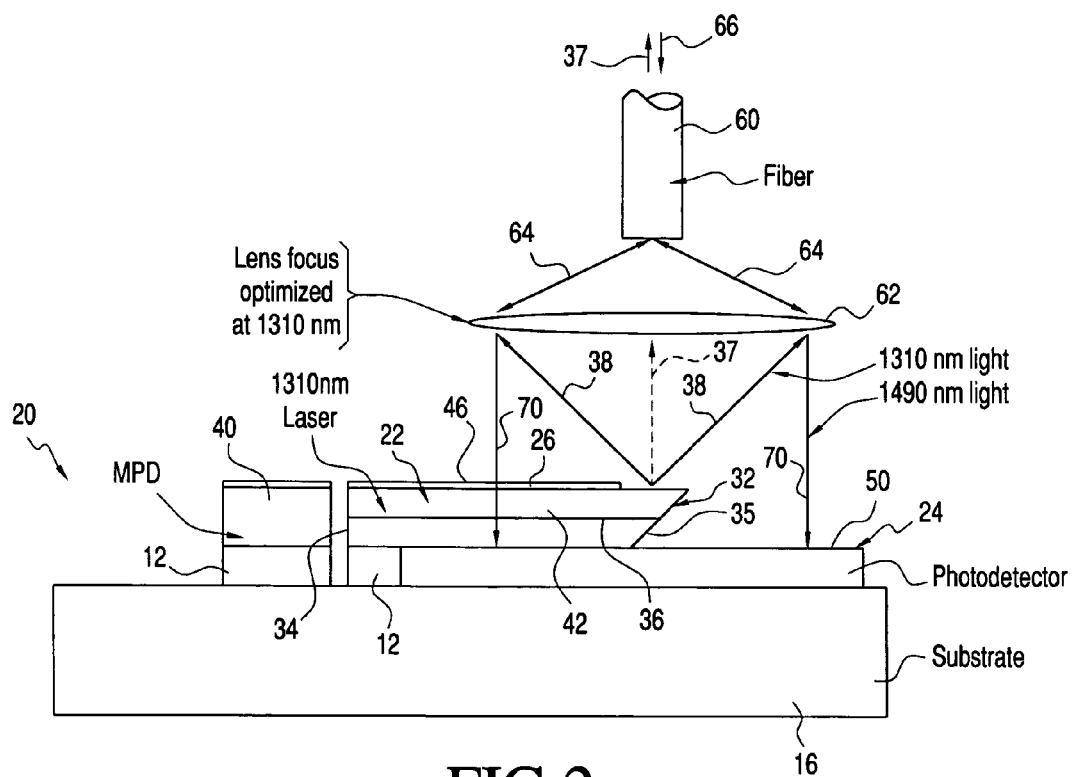
FIG. 2 illustrates a side elevation view of a monolithically integrated photonic device including a surface-emitting laser fabricated in the laser structure and a surface-receiving detector fabricated in the detector structure of the chip of FIG. 1, in accordance with a first embodiment of the invention.
Figure 3:
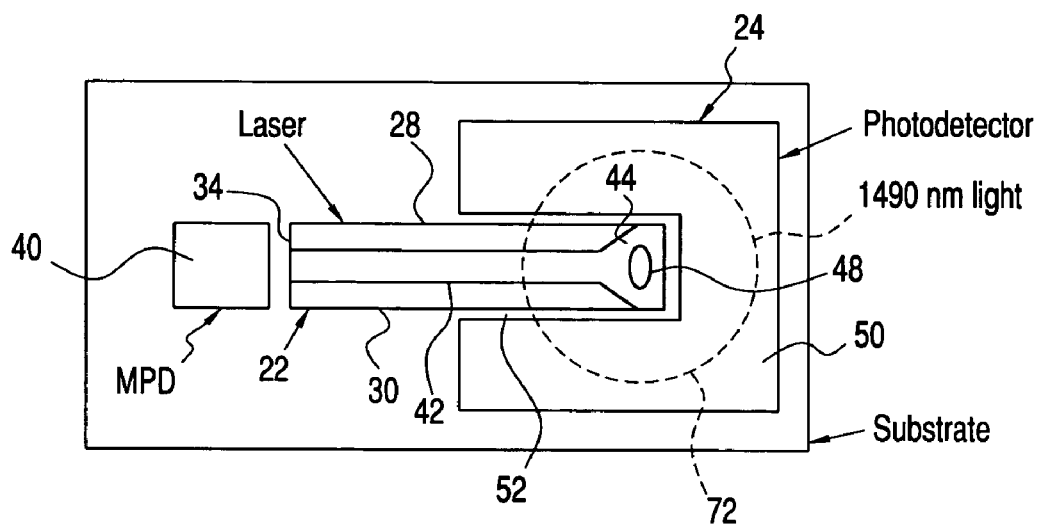
FIG. 3 is a top plan view of the device of FIG. 2.

In a first embodiment of the invention, illustrated in FIGS. 2 and 3, a monolithic photonic device, or chip 20 incorporates an integral laser 22 and an integral detector 24 fabricated in separate mesas in respective structures 12 and 14 of the chip 10. The laser 22 is formed in structure 14 by a conventional masking and etching technique to produce, for example, an elongated, horizontal ridge-type optical cavity having a top surface 26, mesa side walls 28 and 30, and first and second ends 32 and 34. An angled totally internally reflective facet 35 is formed at the first end 32 to direct output light propagated in the laser upwardly out of the cavity through a top emissive surface, while the second end 34 of the cavity is formed by a vertical, reflective facet to permit lasing in the optical cavity. The angled facet 35 at end 32 is fabricated by etching the structure 14 downwardly and inwardly at or near a 45° angle with respect to the top surface 26, and causes light generated in the optical cavity to be emitted in a direction that is essentially perpendicular to the surface 26 and to the plane 36 of the active material in the horizontal laser, the emitted light beam traveling upwardly in the direction indicated by arrow 37. The limits of the output beam are generally indicated by arrows 38. The laser 22 and photodetector 24 are electrically and optically isolated from one another in this arrangement. Optical isolation is improved by incorporating an absorbing or blocking layer on the laser or the detector. A semiconductor of the appropriate bandgap may be incorporated as an additional and top layer in the detector epitaxy to highly absorb one wavelength while allowing other wavelengths of light through. A metallic layer with an underlying dielectric layer may be used to block stray or unwanted radiation from the laser in certain locations.

At the second end 34 of the laser, the end facet is formed at 90° angle to the longitudinal axis of the laser cavity. Adjacent this end of the laser is a monitoring photodetector (MPD) 40, formed in the laser epitaxial structure 14 by masking and etching. The laser optical cavity 22 is masked and etched to form a ridge 42 extending between ends 32 and 34 above the active region 36 in structure 14, with the ridge being widened, as at 44 in FIG. 3, at the emitter end of the laser to provide an open area above the angled facet 35 to allow the emitted beam 37, which may be circular or oval, to exit the optical cavity without distortion. The top of the ridge is coated with an electrical metallization material 46 to permit energization of the laser by a suitable bias voltage. This metallization is typically coated on a top layer of the laser structure, which may be a low bandgap semiconductor such as InGaAs, that allows ohmic contact with the metallization layer. An aperture 48 may be formed in the top layer or layers of structure 14, as needed, to remove material that might absorb the emitted light.

The detector 24 is fabricated as a part of the masking and etching process that forms the laser 22. As illustrated, the portion of structure 14 that overlies the detector structure 12 around the laser is removed to expose the top surface 50 of the detector structure. The structure 12 is further etched in the region immediately surrounding the laser 22 to form a trench 52 that separates the laser from the detector. The trench extends down to, and preferably a short distance into, the substrate 16 to produce separate laser and detector mesas. The detector may be further shaped by removing a portion of layer 12 to form a detector mesa defined by trench 52, as illustrated in FIGS. 2 and 3.

The light output from photonic device 20 may be coupled to an external input/output device such as an optical fiber 60 by way of a lens 62. Because of chromatic aberrations such a lens will focus light of a particular wavelength, but will not focus light of a different wavelength. This capability is used in the present invention to cause outgoing light 37 produced by laser 22, which may, for example, be a beam having a wavelength of 1310 nm, to be focused onto the end of fiber 60, as indicated by arrows 64. Incoming light 66 of a different wavelength than the outgoing light, for example 1490 nm, received from the fiber 60, is directed to the lens 62, as indicated by arrows 64. Because of its wavelength, this received light is not tightly focused by the lens 62, as is indicated by beam limit arrows 70. As a result, the incoming light is not focused on the emitter end of laser 22, but instead is spread out and impinges on the detector 50 in the region 72 illustrated by dashed lines in FIG. 3. The preferred design of the laser and detector mesas positions the emitter region of the laser essentially in the center of the detector 50. If the incoming light 66 is substantially the same wavelength as the outgoing light 37, for example both at about 1310 nm, with a mismatch in coupling between the laser and a fiber through a lens, light detection on the detector 50 is possible. Optical isolation between the laser and detector is improved by incorporating an absorbing semiconductor layer of a bandgap corresponding to wavelength larger than 1310 nm, but smaller than 1490 nm on top of the detector structure. This absorbing layer is selected to be InGaAsP with a bandgap corresponding to 1440 nm so that is absorbs unwanted 1310 nm light while allowing 1490 nm light through to the detector for detection.

Figure 4:
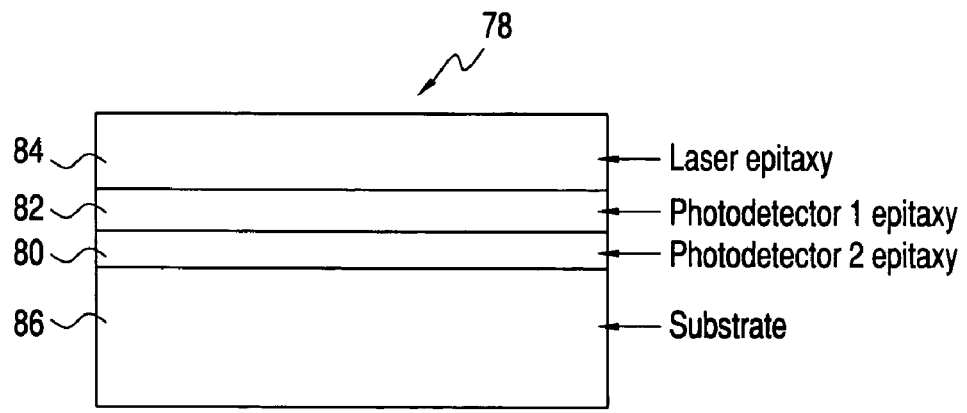
FIG. 4 illustrates a three-layer epitaxial chip structure including a laser structure and two detector structures on a substrate.

A second embodiment of the invention is illustrated in FIG. 4, wherein a chip 78 includes three epitaxial structures, detectors 80 and 82 and laser 84, which are fabricated on a substrate 86. Those semiconductor structures may share common layers to facilitate the fabrication of the device. For example, a highly doped semiconductor layer can be introduced between detector layers 80 and 82 to provide a ground plane to improve electrical isolation and high-speed performance.

Figure 5:
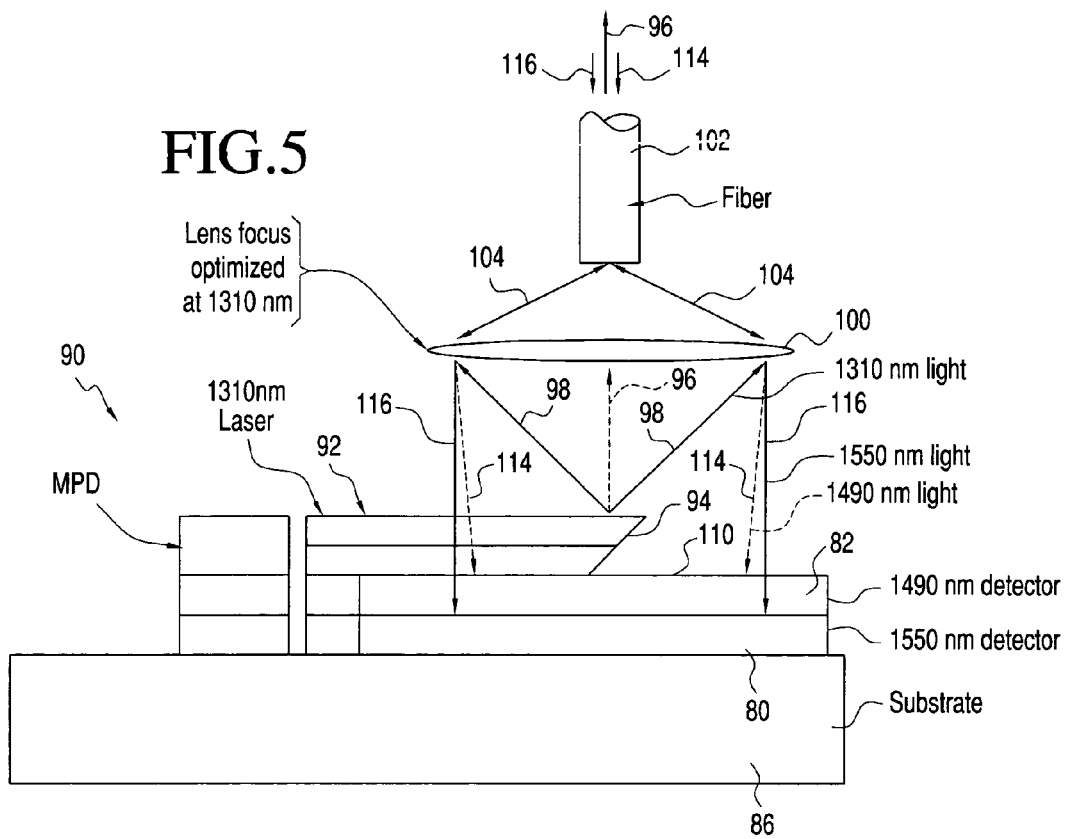
FIG. 5 is a side elevation view of a monolithically integrated photonic device including a surface-emitting laser fabricated in the laser structure and two surface-receiving detectors fabricated in the detector structures of the chip of FIG. 4, in accordance with another embodiment of the invention.

A monolithically integrated photonic device 90, illustrated in FIG. 5, may be fabricated from chip 78 in the manner described above with respect to the device of FIGS. 2 and 3. In this case, a laser 92 is fabricated, as by masking and etching, in laser structure 84, with the etching forming a trench, similar to the trench 52 of FIG. 3, extending downwardly through both detector structures 80 and 82 to the top of substrate 86, so that the laser and the surrounding detectors are located on separate mesas. The laser is etched to form an angled facet 94, which reflects light propagating in the laser upwardly and out of the laser. The emitted light beam 96, which has limits defined by arrows 98, is directed upwardly to a lens 100, which focuses the light on an input/output device 102 such as an optical fiber, as indicated by arrows 104.

The laser structure 84 is removed, as by etching, from the top surface 110 of the detector structure 82 to expose the surface-receiving detector layers 80 and 82 to a light beam 114 which is received by the photonic device 90 from fiber 102. This received light is of a different wavelength than that of the emitted beam 96, and accordingly is directed by lens 100 onto the detector surface 110, as illustrated by arrows 114 and as described with respect to FIGS. 2 and 3. The detector structure 82 is responsive to the wavelength of this beam to produce a suitable output by way of an electrode connected to detector 82. In addition, the photonic device 90 can respond to a second input beam 116 of still another wavelength, which is directed by lens 100 onto the top surface 110 of detector structure 82, as indicated by arrows 116. The detector structure 82 is not responsive to this beam, but the light passes through it. The underlying detector structure 80 receives the beam, as indicated by the arrows 116, and responds to it to produce a corresponding output on a suitable electrode (not shown).

The photonic device 90, which may be referred to as a triplexer, may emit light having a wavelength in the range of 1310 nm±40 nm, while the bandgaps of the detector layers may be selected so that detector 80 receives light in the range of 1550 nm±10 nm, and detector 82 receives light in the range of 1490 nm±10 nm. To do this, the bandgap of detector 82 may be selected to detect light below 1520 nm so that light having longer wavelengths will pass through it to the underlying detector structure 80. The detector structure 80 may be either a broadband detector or a detector having a bandgap optimized to receive light having a wavelength below 1580 nm.

Figure 6:
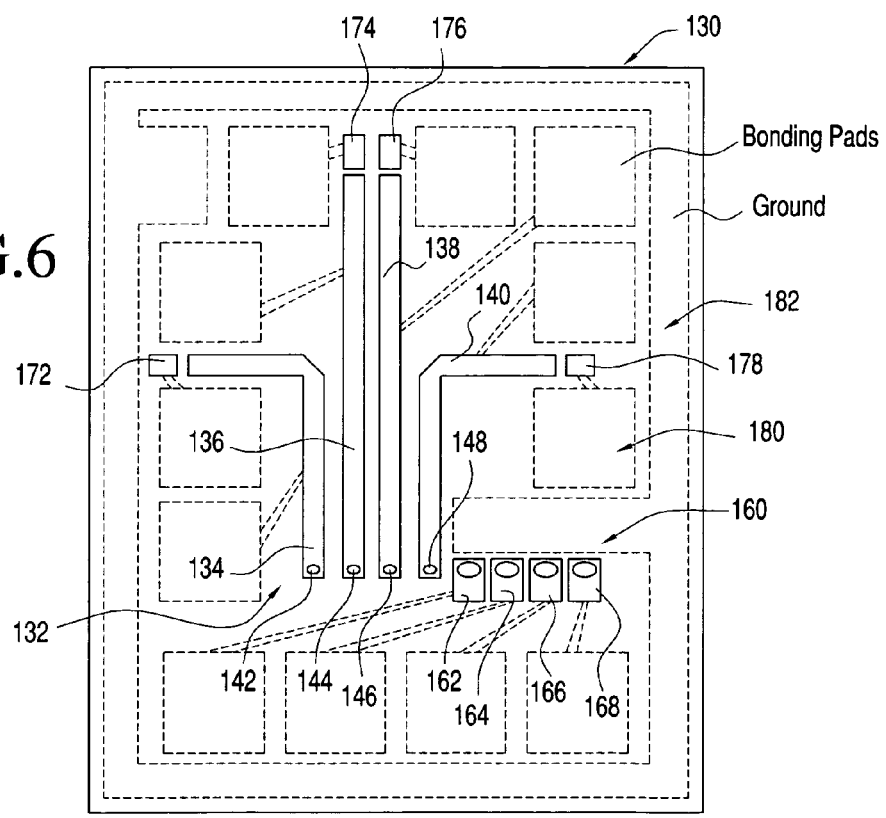
FIG. 6 is a top plan view of a monolithically integrated photonic device incorporating an array of surface-emitting lasers and an array of surface-receiving detectors in corresponding laser and detector structures on a common chip in accordance with another embodiment of the invention.
Figure 7:
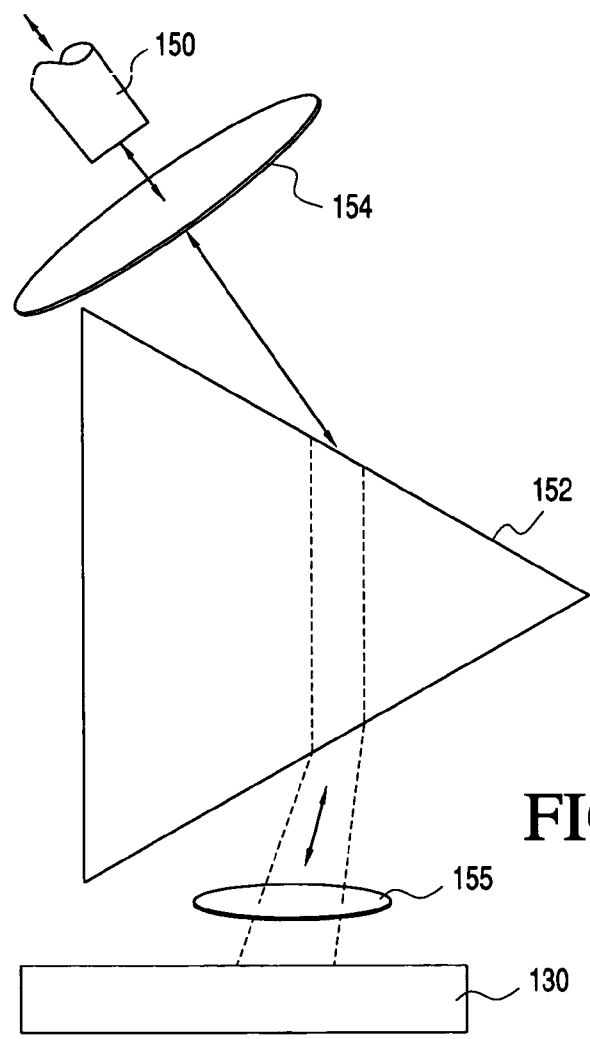
FIG. 7 is a side elevation of the device of FIG. 6 combined with an external prism and lens for optically coupling the lasers and detectors on the chip to an optical fiber.

Although the above-described embodiments show a single laser emitter location and a single detector location surrounding the laser emitter, it will be apparent that the integral photonic device of the invention may incorporate multiple laser locations and multiple detector locations on a single chip, for example as illustrated in the top plan view of FIG. 6. In this figure, a photonic chip 130 incorporates an array 132 of surface emitting lasers, such as lasers 134, 136, 138 and 140, fabricated in an epitaxial laser structure, as described above. The lasers are illustrated as forming generally parallel light emitting channels, although other chip architecture designs can be used. Preferably, the emitter surfaces 142, 144,146 and 148, respectively, of the lasers are grouped together for convenience in directing their output beams upwardly to a common input/output optical fiber 150, illustrated in FIG. 7, by way of suitable external optics such as a prism 152 and lenses 154 and 155.

The chip 130 may include surface-receiving detectors fabricated around the emitting ends of each of the lasers to receive light from fiber 150, in the manner described above with respect to FIGS. 1-5. Alternatively, and as illustrated in FIG. 6, an array 160 of surface-receiving detectors 162, 164, 166 and 168 may be provided at a location adjacent to the emitters and grouped for convenience in receiving input light from the input/output fiber 150. Here again, the surface architecture of the chip may be varied from that illustrated in the figure.

As illustrated, an MPD device may be provided to monitor each of the lasers, as illustrated at 172, 174, 176 and 178, and suitable bonding pads 180 and ground lines 182 may be provided on the surface of chip 130, as required, in known manner. As in prior embodiments of the invention, the lasers 132 are fabricated in a first epitaxy structure, while the detectors are fabricated in a second epitaxy structure on a substrate. Each laser in the array 132 may emit light in a different wavelength band; for example, the surface-emitting lasers 134, 136, and 140 may emit light at wavelengths of 1470 nm, 1490 nm, 1510 nm, and 1530 nm, respectively. Similarly, the detectors 162, 164, 166, and 168 may detect light at respective wavelength bands of 1550 nm, 1570 nm, 1590 nm, and 1610 nm, for example.

In order to have large wavelength variations between the several lasers, for example for use in applications such as coarse wavelength division multiplexing (CWDM) where the channel spacing is about 20 nm, the active region of the laser structure, which is the first, or top, epitaxy structure as described above, needs to have its bandgap modified so as to allow lasers with appropriate wavelengths to be fabricated for the laser array. This is done by one of many known processes for forming the first epitaxial structure; for example by impurity-free vacancy diffusion or by multiple epitaxial depositions.

The monolithically integrated emitters and detectors of the invention may also be fabricated as edge-emitting lasers (EEL) with surface-receiving detectors, in the manner illustrated in FIGS. 8-15, to which reference is now made. As illustrated in the side elevation view of FIG. 8, a laser/detector chip 200 includes an edge-emitting laser 202 which may be, for example, a Fabry-Perot (FP) laser fabricated in an epitaxial laser structure 204, and a surface-receiving detector 206 fabricated in an epitaxial detector structure 208 on a substrate 210. These structures are formed by masking and etching techniques as described above, with the difference that a reflective base element 212 is provided adjacent and aligned with, but spaced from, an emitter facet 214 of the laser 202.

Figure 8:
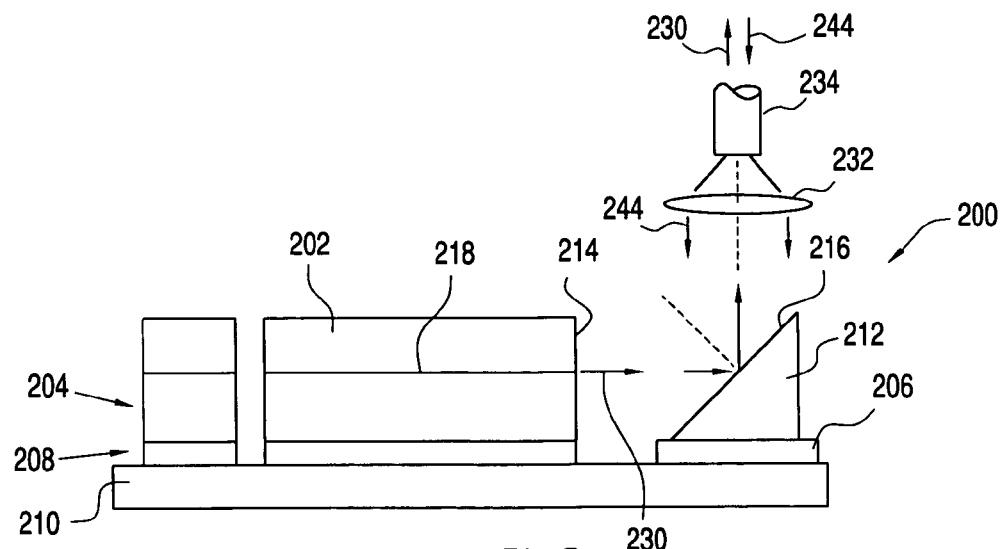
FIG. 8 is a side elevation of a monolithically integrated photonic device incorporating an edge-emitting laser fabricated in a laser structure and a surface-receiving detector fabricated in a detector structure of the chip of FIG. 1, and incorporating a deflector for emitted light in accordance with another embodiment of the invention.
Figure 9:
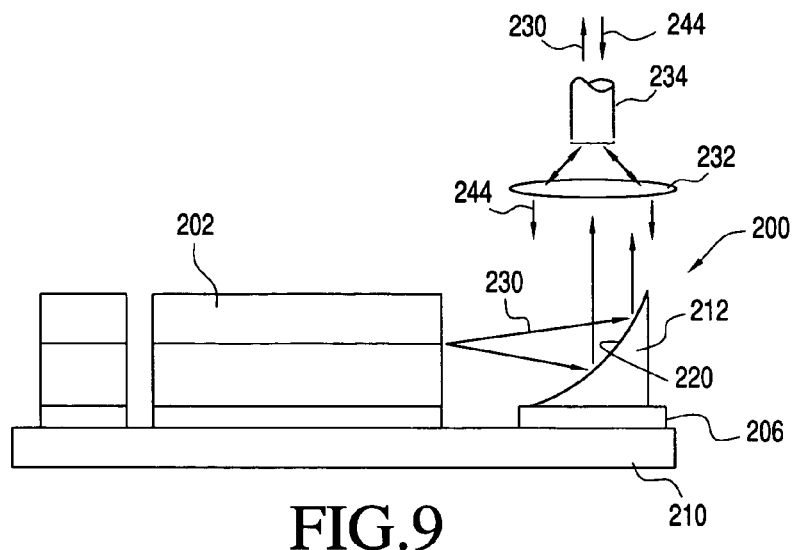
FIG. 9 is a side elevation of a modified form of the device of FIG. 8, incorporating a deflector having a curved surface.
Figure 10:
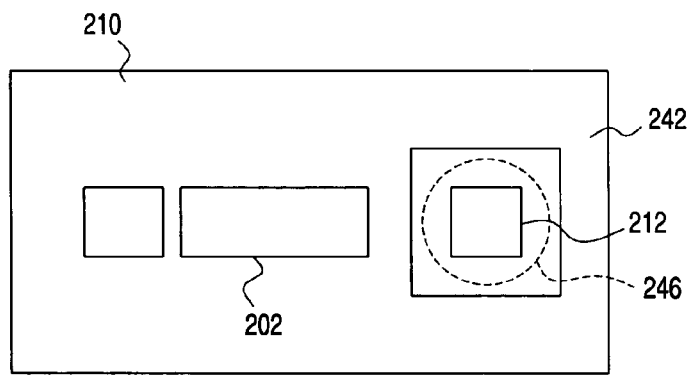
FIG. 10 is a top plan view of the device of FIG. 9.

Element 212 may include a flat reflective surface 216 aligned with the optical axis 218 of laser 202 at its active region, as illustrated in FIG. 8, or may include a curved surface 220, as illustrated in FIG. 9. Light beam 230 emitted by laser 202 is deflected by surface 216 or by surface 220 through suitable external optics such as lens 232 to an input/output device such as an optical fiber 234. The base element 212 and the surfaces 216 and 220 may be fabricated by lithography and etching of the semiconductor laser and detector structures. As illustrated in FIG. 10, the detector structure is shaped as by etching to surround the base element 212, so that received light 244 from the optical fiber 234 will be directed by lens 232 onto the surface of the detector in the region indicated by dotted line 246, in the manner described above with respect to FIGS. 1-5.

The base element 212 alternatively may be fabricated by electron beam deposition of, for example, silicon, through a lift-off process to provide a convenient structure on top of the detector 206 for reflecting the output of the EEL 202 in a direction perpendicular to the surface of the chip.

Figure 11:
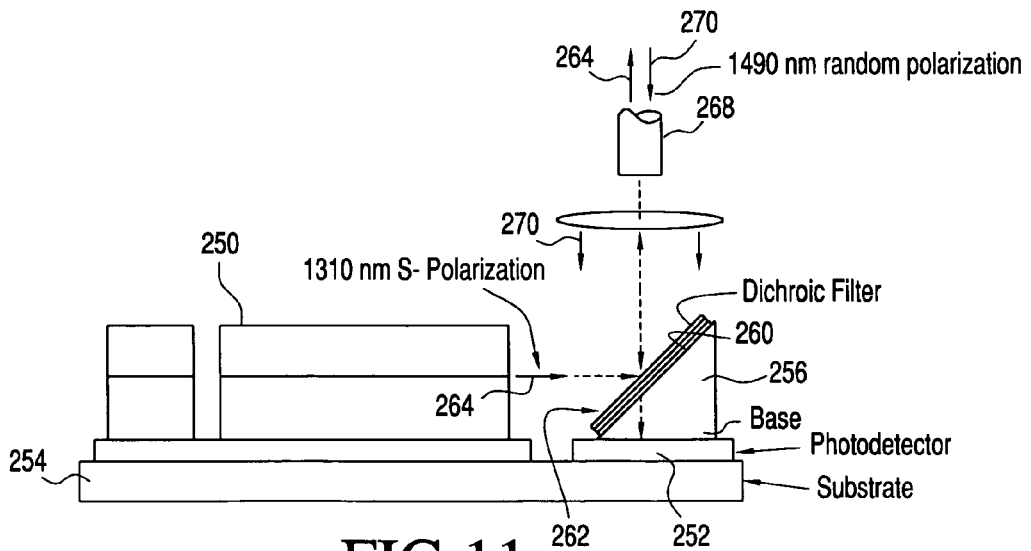
FIG. 11 is a side elevation of a modified form of the photonic device of FIG. 8, wherein the deflector includes a dichroic coating, which reflects light emitted by the laser and which passes received light through the body of the deflector to the underlying detector structure.
Figure 12:
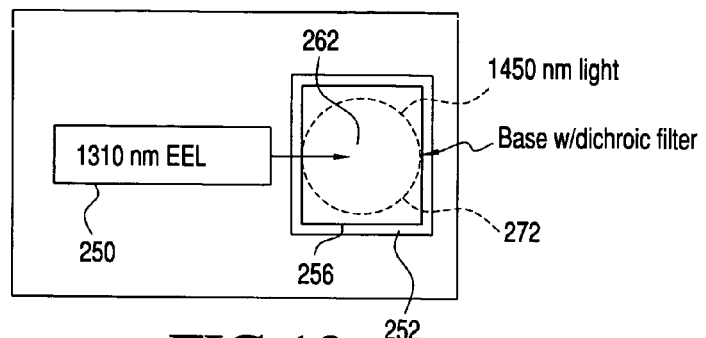
FIG. 12 is a top plan view of the device of FIG. 11.

Another alternative is illustrated in FIGS. 11 and 12, wherein an edge-emitting laser 250 is integrated with a surface-receiving detector 252 on a substrate 254, with a reflective base element 256 mounted on the surface of, or positioned above, the surface of the detector. The base element 256 includes a surface 260, which may be either flat or curved, and a dichloric filter 262 on surface 260. The filter may be a multilayer coating on the surface 260, which is designed to reflect one wavelength band and to allow another wavelength band to pass through. For example, a beam 264 emitted from facet 266 of laser 250, which may have a wavelength band of 1310 nm±40 nm (and which may be essentially s-polarized) and directed at an angle of 45° onto filter 262 will be almost completely reflected upwardly through external optics 266 to an input/output device such as optical fiber 268. Incoming light 270, which may have a wavelength band of 1490 nm±10 nm, also is directed at an angle of 45° to the filter 262, but this wavelength is almost completely transmitted through the filter to the underlying detector 252. As illustrated in the top view of FIG. 12, the received light 270 is directed onto the detector within the dotted line 272, including the region beneath the base element 256, to provide a greater area of detection, and thus greater sensitivity to received light.

Figure 13:
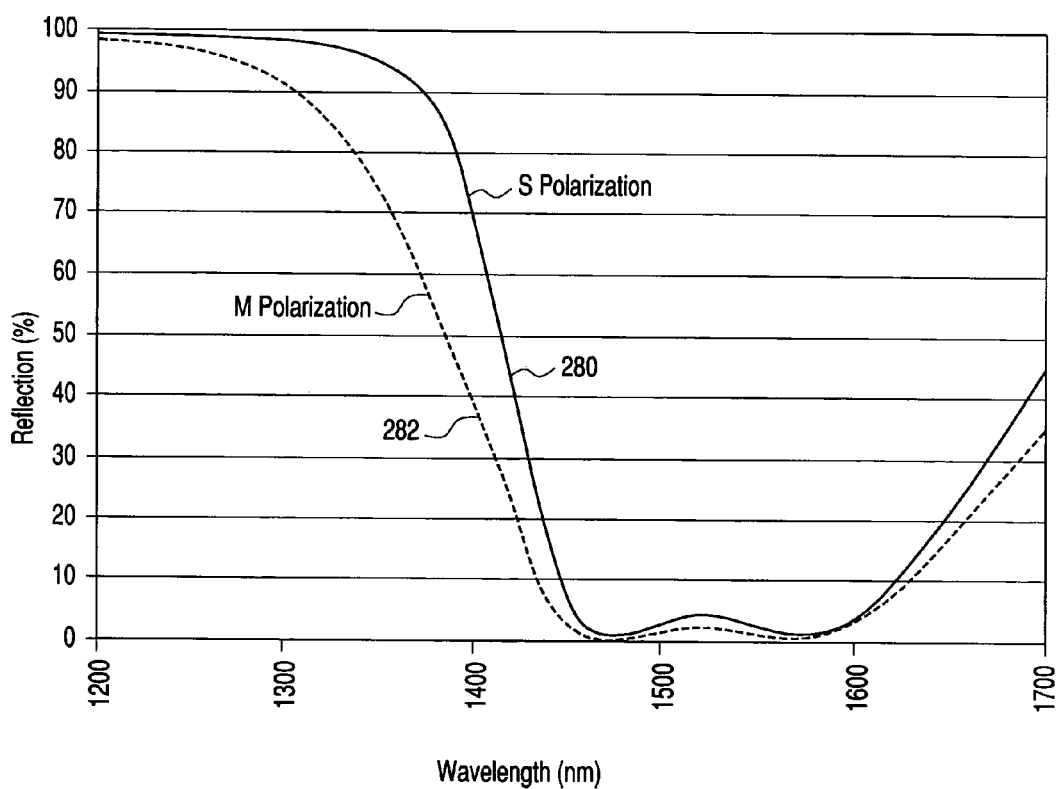
FIG. 13 is a graph of the reflection characteristics of an example of a dichroic filter for the device of FIG. 11.

The reflection versus wavelength behavior of a typical dichroic filter is illustrated in FIG. 13 by curves 280 and 282. In this case, the base element was InP and the outside medium was air, and nine layers were used to fabricate the filter using conventional design techniques.

Figure 14:
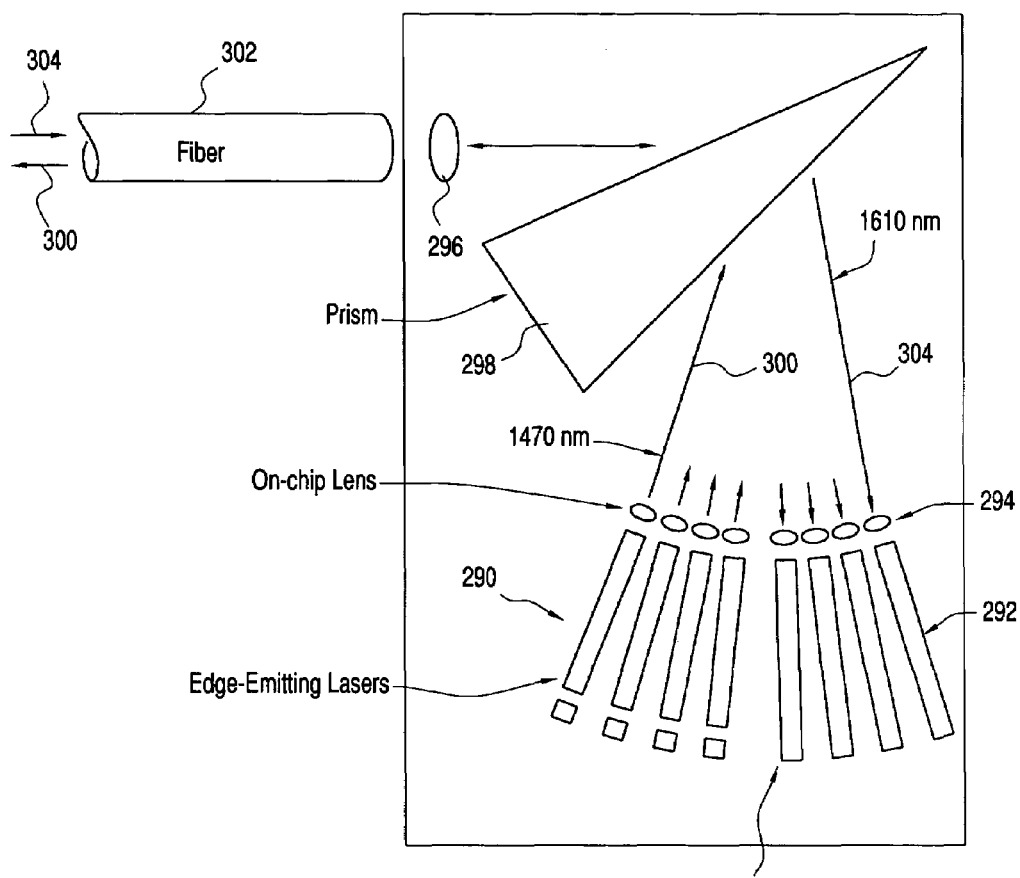
FIG. 14 is a top plan view of a monolithically integrated photonic device incorporating an array of edge-emitting lasers and edge-receiving detectors coupled to an external optical fiber through a prism.
Figure 15:
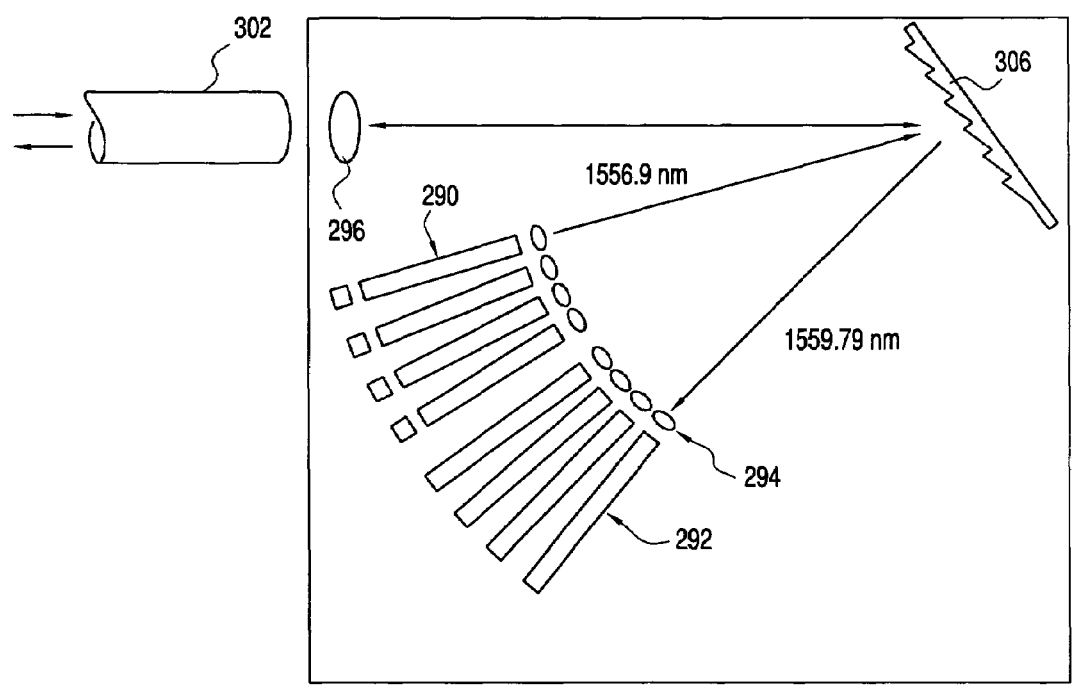
FIG. 15 is a top plan view of a monolithically integrated photonic device incorporating an array of edge-emitting lasers and edge-receiving detectors coupled to an external optical fiber by way of a grating.

FIGS. 14 and 15 illustrate arrays of edge-emitting lasers and edge-receiving detectors integrated on chips with on-chip optical elements such as lenses and prisms. In FIG. 14, an array 290 of edge-emitting lasers and an array 292 of edge-receiving detectors are fabricated in respective epitaxial laser and detector structures on a common substrate. On-chip lenses 294 and 296 and prism 298 are fabricated in alignment with the optical axes of the lasers and detectors in the arrays 290 and 292, using the process described in U.S. Pat. No. 6,6532,44, to direct light 300 emitted from the lasers to an optical fiber 302. The optical elements similarly direct received light 304 from fiber 302 to the detectors of array 292.

Alternately, the on-chip prism 298 is replaced by an on-chip grating 306 to allow for a larger degree of dispersion for closely-spaced wavelengths, as illustrated in FIG. 15. Other arrays of closely-spaced laser channels for different light wavelengths may be formed on the same first epitaxial structure by modifying the architecture of the chip.

Although the present invention has been illustrated in terms of preferred embodiments, it will be understood that variations and modifications may be made without departing from the true spirit and scope thereof, as set out in the following claims.

What is claimed is:

1. A photonic device comprising:
   a substrate;
   an epitaxial detector structure epitaxially deposited on said substrate, said epitaxial detector structure including an n-type layer and a p-type layer;
   a trench passing through said epitaxial detector structure and separating said epitaxial detector structure into a first and a second portion;
   an epitaxial laser structure epitaxially deposited on said first portion of said epitaxial detector structure;
   an etched-facet laser fabricated in said epitaxial laser structure on said first portion of said epitaxial detector structure, said etched-facet laser including at least one etched facet; and
   a detector fabricated in said second portion of said epitaxial detector structure.

2. The device of claim 1, wherein said etched-facet laser has at least one emitter end.

3. The device of claim 2, wherein said etched-facet is at said emitter end of said laser at an angle of about 45° to provide a surface-emitting laser.

4. The device of claim 2, wherein said detector substantially surrounds the emitter end of said laser.

5. The device of claim 1, wherein said detector is a p-i-n diode.

6. The device of claim 1, wherein said detector is an avalanche photodetector.

7. The device of claim 4, wherein said laser structure includes an active layer that is formed from a material which causes said laser to emit light of a first wavelength, and wherein said detector structure includes a photosensitive layer that is formed from a material which causes said detector to detect light in a range of wavelengths that includes a second wavelength that is different from said first wavelength.

8. The device of claim 7, wherein said laser is a surface emitting laser.

9. The device of claim 7, wherein said trench passes part way into said substrate.

10. The device of claim 3, further including an external optical element for coupling light emitted from said laser to an optical fiber.

11. The device of claim 10, wherein said external optical element includes a lens for directing light emitted from said laser to said fiber.

12. The device of claim 8, further including an external lens optimized to focus said light of said first wavelength to an external optical device, and wherein said lens couples light of said second wavelength received from said external optical device to said detector.

13. The device of claim 2, wherein said laser is an edge-emitting laser fabricated to emit light at a first wavelength, wherein said detector is fabricated to detect light in a range of wavelengths that includes at a second wavelength that is different from said first wavelength.

14. The device of claim 13, further including an optical element on said substrate aligned with said laser to couple light emitted from said laser to an external optical device.

15. The device of claim 14, wherein said optical element is a lens.

16. The device of claim 14, wherein said optical element is a diffracting element.

17. The device of claim 14, wherein said optical element is a reflector.

18. The device of claim 14, wherein said external optical device comprises a lens for directing emitted light to an optical fiber.

19. The device of claim 18, wherein said lens is optimized to couple said emitted light to said fiber, and wherein said lens couples light of said second wavelength received from said fiber to said detector.

20. The device of claim 19, wherein said optical element is a reflector on said substrate for deflecting light emitted by said laser to said lens, said reflector being positioned on said detector to allow light of said second wavelength received from said fiber through said lens to be detected.

21. The device of claim 19, wherein said optical element is a dichroic filter for deflecting light emitted by said laser to said lens and for transmitting light of said second wavelength received from said fiber through said lens.

22. The device of claim 1, wherein said laser is fabricated to emit light of a first wavelength, wherein said detector is fabricated to detect light of a second wavelength, and wherein a second detector is fabricated in said epitaxial detector structure which detects light of a third wavelength.

23. The device of claim 1, wherein an array of lasers is fabricated in said laser structure.

24. The device of claim 23, wherein an array of detectors is fabricated in said detector structure.

25. The device of claim 24, further including optical elements on said substrate for coupling emitted light to an external optical fiber and for coupling light received from said fiber to said detectors.

26. The device of claim 1, wherein said laser and said detector are optically isolated from each other.

27. The device of claim 1, wherein said laser and said detector are electrically isolated from each other.

28. The device of claim 1, wherein said trench passes part way into said substrate.

29. The device of claim 1, wherein said detector is positioned adjacent the etched facet of said laser.

30. The device of claim 1, wherein said etched facet forms an angle of other than 90° with respect to said substrate.

31. The device of claim 13, wherein an absorbing semiconductor layer of material having a bandgap corresponding to a wavelength larger than said first wavelength but smaller said second wavelength is formed on top of said detector to absorb light of said first wavelength but pass light of said second wavelength and thereby optically isolate said laser from said detector.

32. The device of claim 26, wherein an absorbing semiconductor layer of material having a bandgap corresponding to a wavelength larger than said first wavelength but smaller said second wavelength is formed on top of said detector to absorb light of said first wavelength but pass light of said second wavelength and thereby optically isolate said laser from said detector.

* * * * *